METHOD FOR METALLIZING NON-CONDUCTORS

Filed Sept. 19, 1962 2 Sheets-Sheet 1

INVENTOR.
Donald W. Swanson
BY Mueller & Aichele
Attys.

INVENTOR.
Donald W. Swanson
BY Mueller & Aichele
Attys.

United States Patent Office 3,122,449
Patented Feb. 25, 1964

3,122,449

METHOD FOR METALLIZING NON-CONDUCTORS

Donald W. Swanson, Bensenville, Ill., assignor to Motorola, Inc., Chicago, Ill., a corporation of Illinois Filed Sept. 19, 1962, Ser. No. 225,410
13 Claims. (Cl. 117—213)

Figures 1, 2, 3:
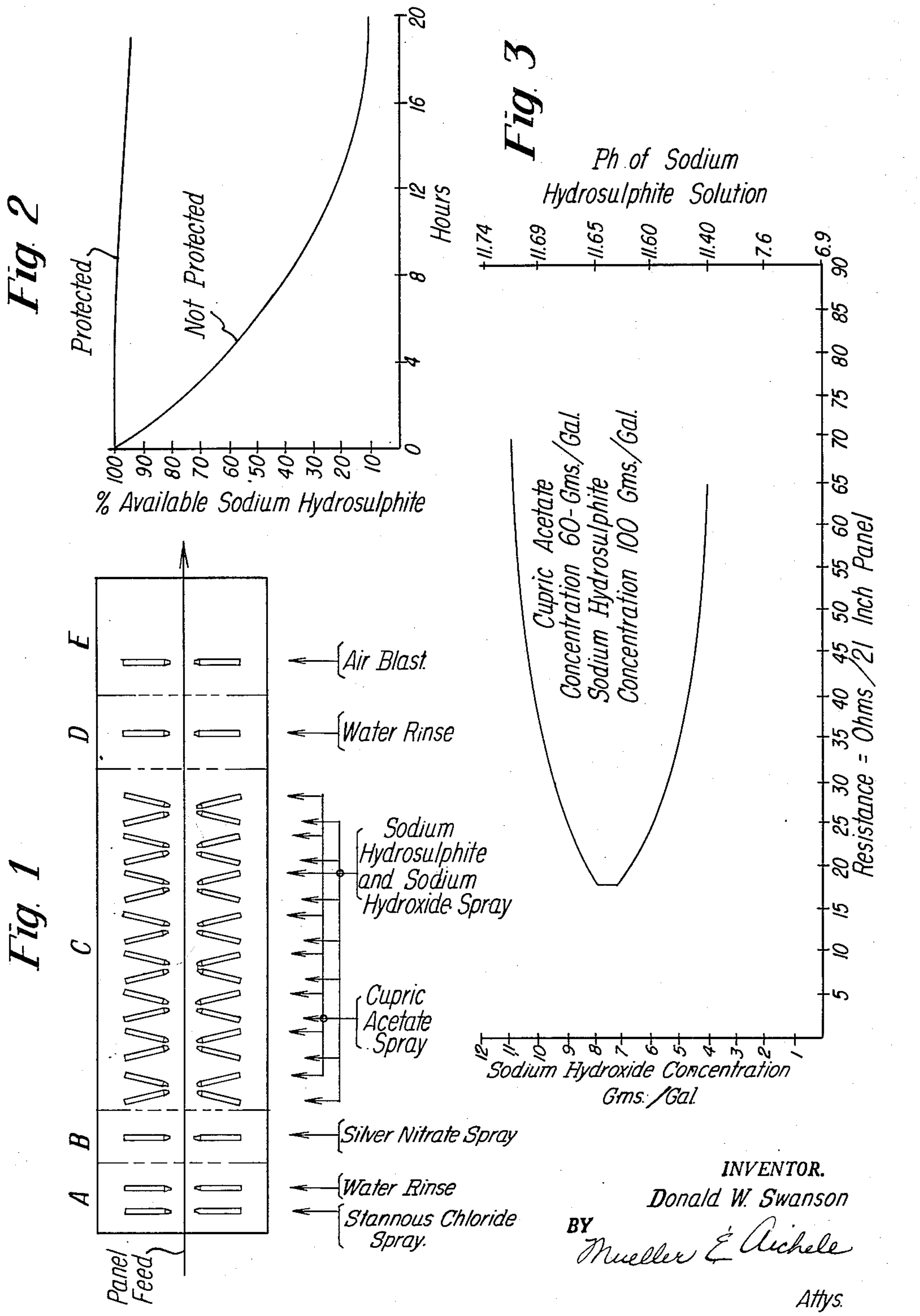

This invention relates to processes for metallizing non-conductive material, such as glass, ceramics, wood, leather, hard rubber, natural resins, or synthetic resins (such as phenol condensation products), and the like. More particularly, the invention relates to the application of a copper film to a non-conducting base by a spray-reduction process, the process being such that the resulting copper film or coating is formed practically instantaneously and has sufficient electrical conductivity to permit the electroplating of a subsequent metallic layer thereon.

This application is a continuation-in-part of application Serial No. 780,165, filed on December 12, 1958, by Donald W. Swanson and assigned to the present assignee, now abandoned.

In recent years, printed or plated circuit processes have gained prominence in the electronic art. By such processes, electronic or electrical circuits are formed directly on an insulating panel thus obviating the need for wire or jumper connections and the many manual operations associated therewith. In one such process, a silver film is applied to an insulating panel by a chemical spray-reduction technique so as to form a conductive base coat over the entire surface of the panel. A resist is then stencil-screened over the base coat in a selected design, so that portions of the base coat corresponding to a desired conductor configuration are left uncovered. The assembly is then placed in a copper electro-plating bath, and copper conductors are built up on the uncovered portions of the base coat. The resist is then removed, and portions of the base coat formerly covered thereby are stripped (e.g. by an acid etch) from the panel so that the copper conductors may be separated and insulated from one another. This produces a plated circuit assembly which comprises an insulating panel with an electrically conductive design deposited thereon.

Details of printed circuit processes such as the one described immediately above may be found in Nieter Patents 2,699,424 and 2,699,425, both of which issued January 11, 1955, and both of which are assigned to the present assignee. These processes have proved practical from every standpoint and have gained a large measure of commercial success. However, several factors have militated against the use of silver for a base coat. The most important reason, probably, is the cost of the silver itself and in the labor and apparatus required to reclaim the excess silver from the waste silver sludge. Moreover, difficulties have been encountered in stripping the silver base coat completely from the portions of the panel between the final conductors in accordance with the final step of the process described above, and it has been found practically impossible to completely remove the silver from these portions. So the final assembly was limited as to the voltages at which it could be used without producing arcing across the copper conductors. Another difficulty with silver has been the fact that it is rather difficult to strip the exposed portions of the silver base coat between the copper conductors without attacking the conductors themselves to an appreciable extent since silver is a noble metal and less susceptible to an acid etch than copper. That is, during the step in which the portions of the silver base coat between the final conductors are removed by etching or the like, the etching solution attacks the copper conductors to a greater extent, than the silver and it is only by making these copper conductors excessively thick as compared with the silver base coat, that it was at all possible to remove a sufficient amount of the silver and still leave sufficient thickness in the copper conductors. There has also been a problem of migration through the panel when silver is used, and it is now suspected that the portions of the silver base coat sandwiched between the copper conductors and the insulating panel of the final assembly might have a tendency to migrate through the insulating panel in time and affect the insulating characteristics.

For the reasons discussed in the preceding paragraph, it has long been realized that copper would form a more satisfactory base coat than silver for printed circuit assemblies. Copper is less expensive than silver and need not be reclaimed. It is easier to etch out the uncovered portions of a copper base coat after the final copper conductors have been electroplated thereon, and the etching affects these conductors only to the extent that a skin of copper is removed therefrom corresponding in thickness only to the thickness of the thin copper base coat. The covered portions of the copper base have no tendency to migrate in the insulating panel, and the etching leaves no trace of residual copper on the areas between the final conductors. However, even though there is teaching in the prior art of methods for depositing a copper film or coating on a non-conductive base, copper films deposited in accordance with prior art practices for the most part do not exhibit sufficient electrical conductivity for satisfactory electroplating thereon of the subsequent copper conductors. The prior processes also usually involve immersion of the insulating panel in selected solutions for relatively long time intervals before a copper coating could be formed on the insulating surface. Because of these drawbacks, the processes of the prior art have never achieved any commercial acceptance in the printed circuit field insofar as the formation of a copper base coat on an insulating panel is concerned.

It is therefore an object of the present invention to provide an improved, convenient, dependable, rapid and inexpensive process for depositing on an insulating panel a copper base coat capable of sufficiently high electrical conductivity to permit a subsequent metallic layer to be electroplated thereon.

Another object of the invention is to provide such an improved process in which the formation of the copper base coat is practically instantaneous, so that spray-reduction may be used rather than immersion, such sprap-reduction being more desirable from a commercial standpoint since it lends itself to continuous production and is not subject to depletion or other drawbacks that arise when immersion is used.

A feature of the invention is the provision of a process whereby a cupric acetate solution and an alkaline sodium hydrosulphite solution are applied to the surface of an insulating panel to produce a conductive copper base coat, with the alkalinity of the hydrosulphite solution being controlled to provide a base coat of sufficient conductivity to enable subsequent electrodepositing of electrical conductors thereon.

Another feature of the invention is the provision of such a process in which the panel surface is first treated by a stannous chloride solution and then by a silver nitrate solution, prior to the application of the cupric acetate and sodium hydrosulphite solutions, for sensitizing and catalyzing purposes.

Yet another feature of the invention is the provision of such a process in which the stannous chloride and silver nitrate solutions are applied by individual sprays, and the cupric acetate and sodium hydrosulphite solutions are then applied by means of dual sprays.

Figure 4:
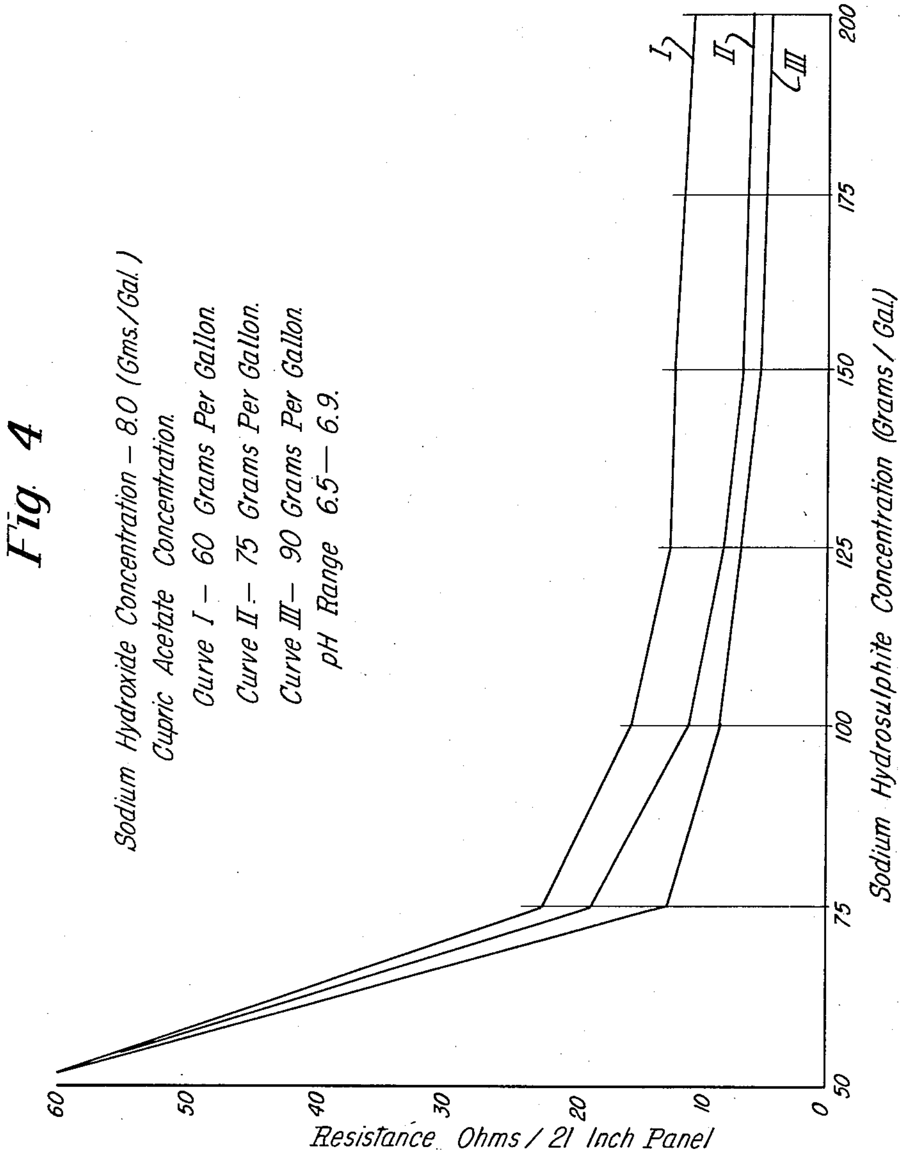

The invention will be described with reference to the accompanying drawing in which:

FIG. 1 is a schematic representation of apparatus for carrying out the improved process of the present invention; and FIGS. 2–4 are curves useful in explaining the process.

In practicing the process of the invention, the surface of a selected insulating panel is carefully cleaned, and the surface is then sentitized by means of a sensitizing solution such as stannous chloride, although this sensitizing step is not essential. The panel is then rinsed to reduce the stannous chloride sensitizing solution on its surface to a trace, and silver nitrate solution is then sprayed onto the surface. Immediately thereafter, a panel is subjected to a dual spray of an aqueous solution of cupric acetate and an aqueous, alkaline solution of sodium hydrosulphite. The alkalinity of the latter solution is controlled by the addition to the hydrosulphite solution of an alkali such as the salt of an alkali metal or a hydroxide as a stabilizer, as for example, sodium hydroxide of a selected concentration. When these steps are followed, conductive copper is formed practically instantaneously as a thin coating over the surface of the insulating panel, and this film or coating has sufficiently high electrical conductivity to be capable of receiving a subsequent electro-deposition so that it may selectively be built up to a sufficient thickness for printed circuit use.

In accordance with the concept of the present process, metallic copper is deposited on the insulating panel by the wet chemical spray-reduction of cupric acetate by sodium hydrosulphite. The principal reaction, expressed in ionic form, is considered to be:

$$Cu^{++}+S_2O_4^{--}+2H_2O \rightarrow Cu\downarrow+2HSO_3^{-}+2H^{+}$$

or $$Cu(C_2H_3O_2)_2+Na_2S_2O_4+2H_2O \rightarrow Cu+2NaHSO_3+2HC_2H_3O_2$$

With reference to FIG. 1, the following is a description of a specific example of the process of the invention. An insulating panel (composed of, for example, a thermosetting resin such as a phenol condensation product, or other insulating material) is mechanically roughened by the use of a pressurized blast of a suitable abrasive such as sand, aluminum oxide, or the like, directed onto one or both surfaces of the panel. After this operation, air is blown onto the surface of the insulating panel to remove the sand particles, and the panel is then thoroughly cleaned by means, for example, of a water spray. The surface of the panel is mechanically roughened in the manner described above to improve the adhesion of the base coat to its surface, and, of course, other means may be used to achieve this purpose instead of mechanical roughening (for example, suitable adhesives may be applied to the panel surface).

The schematic representation of FIG. 1 may be considered a top view of a coating apparatus through which a succession of insulating panels are passed between a series of nozzles, so that various solutions may be sprayed completely over both surfaces of each of the insulating panels. This permits the copper base coat to be formed on both surfaces of each panel which is desirable for most printed circuit assemblies.

As shown at A in FIG. 1, prepared insulating panels are first sprayed with a stannous chloride sensitizing solution and they are then water rinsed to reduce the stannous chloride on the surfaces to a trace. This step is not essential to the process because a satisfactory copper base coat can be deposited without it, but it is preferred to use this sensitizing step because its use is conducive to the rapid and uniform reduction of the copper salt which will be described. The composition of the stannous chloride solution is as follows:

| | | |
|---|---|---|
| Stannous chloride ($SnCl_2.H_2O$) | grams | 20 |
| Hydrochloric acid (HCl) (37%) | milliliters | 50 |
| Water | gallon | 1 |

The surfaces of the insulating panels are then sprayed with a silver nitrate solution as shown at B in FIG. 1. This catalyzes the surfaces so that the metallic copper can "seed-out," from the solutions subsequently applied to these surfaces. The silver nitrate solution is as follows:

| | | |
|---|---|---|
| Silver nitrate ($AgNO_3$) | grams | 4 |
| Water | gallon | 1 |

Immediately after the surfaces of the insulating panel have been sprayed with the silver nitrate solution, they are sprayed with the copper salt and solutions as shown at C in FIG. 1. This is accomplished by passing the panel between a series of pairs of spray nozzles until a copper base coat of a desired thickness is built up on each surface. One nozzle of each pair sprays cupric acetate and the other sprays a hydrosulphite solution onto the surfaces of the panel. The two solutions do not come in contact with each other until the spray patterns converge about two inches from the surface of the insulating panel. A plurality of pairs of such nozzles are shown, since it is desirable to have a multiple of passes in order to build up the desired thickness of the copper base coat, as noted above. The composition of the cupric acetate solution is as follows:

| | | |
|---|---|---|
| Cupric acetate ($Cu(C_2H_3O_2)_2H_2O$) | grams | 90 |
| Water | gallon | 1 |
| Wetting agent | gram | 1 |

(The wetting agent may be an arylalky polyether alcohol, such as Triton X–114 which is a tradename for a detergent marketed by the firm of Rohm and Haas.)

The composition of the sodium hydrosulphite solution is:

| | | |
|---|---|---|
| Sodium hydrosulphite ($Na_2S_2O_4$) | grams | 125 |
| Sodium hydroxide (NaOH) | do | 8 |
| Water | gallon | 1 |

The insulating panels are passed through the cabinet of FIG. 1 at a rate of about eight twenty-one inch strips a minute. The surfaces of the panels are sensitized in the manner described above, and they are then passed in front of a plurality of nozzle pairs for spraying the copper reducing solutions. The spraying system may use hydraulic atomization rather than pneumatic due to the desirability of guarding the hydrosulphite solution against air oxidation. Losses of approximately 18.7% of available hydrosulphite were experienced with pneumatic systems as compared with approximately 4.7% loss with a hydraulic system. Of course, pneumatic systems can be used but the sodium hydrosulphite concentration must be increased as, for example, from 125 grams/gallon to 140 grams/gallon when the same volume of fluid is used as with hydraulic atomization.

Pneumatic or air type spray systems have the advantage that the volume of fluid and the spray pattern can be controlled by the adjustment of the air flow in the system. This enables the amount of fluid and its distribution on the panels to be optimized for the nozzle pairs without excessive waste sludge. Thus, by use of controlled flow in pneumatic systems it is possible to reduce the total volume of fluid needed for a uniform conductive base coat to an extent which is more economical on a production basis than hydraulic systems.

The surface of the reservoir for the hydrosulphite must also be protected for example, with a layer of mineral oil or commercial toluene (toluol) so as to prevent rapid air oxidation. As shown in FIG. 2, without such protection, the percentage of available sodium hydrosulphite is reduced practically to zero in the space of one day, but it is reduced merely by about 5% when protected.

After the completion of the spray-reduction process, the panels pass to D in FIG. 1 where they undergo a water rinse and then at E they receive an air blast for drying purposes.

As previously pointed out, the resulting copper base coat must be suitable for subsequent electroplating of electrical conductors thereon. For this purpose, it has been found that the copper film should have a resistance that is no higher than 20 ohms, preferably less than 10 ohms, for an insulating panel having a length of 21 inches and a width of 6 inches. (This panel will be used as a standard for purposes of the description herein.) It is also essential that the copper have good adhesion to the insulating panel and be accepted by all areas of the panel especially the bores of any punched holes in the panel which are to be rimmed with the base coat.

It was found that when the pH of the hydrosulphite used in the process described above was increased from, for example, 11.4 that the brightness and conductivity of the copper base coat increased. This increase continued until the concentration of about 8 grams per gallon of the sodium hydroxide was reached with a resulting pH to the sodium hydrosulphite of 11.65. Any increase in this concentration, and the conductivity of the copper base coat began to fall off, although the copper film itself continued to get brighter. This is shown in the curve of FIG. 3 which shows that close control must be maintained on the concentration of the sodium hydroxide, which determines the pH of the sodium hydrosulphite. When the pH of the sodium hydrosulphite is below the acceptable range, surface residue (which is probably a mixture of copper, copper oxide, copper sulphide, copper sulphite, copper sulphate, etc.) impairs the conductivity of the base coat. On the other hand, above the pH range, although the base coat is extremely bright, it is too thin to be a good electrical conductor. Therefore, the optimum electrical conductivity of the base coat is at the "nose" of the curve of FIG. 3, and this occurs when the concentration of the sodium hydroxide is between 7 and 8 grams per gallon with the resulting pH of the sodium hydrosulphite between about 11.62 and 11.65.

Although not recommended, acetic acid ($HC_2H_3O_2$) can be added to the cupric acetate solution to aid in dissolving any residue that might occur on the surface of the base coat as a result of using technical grade salts. If an equivalent amount of sodium hydroxide is added to the hydrosulphite solution, the action of the process is not impaired. Similarly, it may be necessary to vary the amount of sodium hydroxide added to the hydrosulphite solution according to the amount of free acetic acid which may be present in commercial grades of cupric acetate.

Although sodium hydroxide is used in the specific example set forth above for controlling the alkalinity of the sodium hydrosulphite solution, other compounds of an alkaline reaction such as the hydroxides and some salts of alkali metals (i.e. sodium, potassium, rubidium, lithium, and cesium) may also be used. Sodium salts are economical and readily available, and sodium sulfide, sodium sulfite, and sodium acetate (approximately .3–1.5, 10–20, and 30–40 grams per gallon of each, respectively, in the above specified cupric acetate and sodium hydrosulphite solutions) are among those which produce satisfactory results. These and other alkalis serve to stabilize the sodium hydrosulphite solution so that a copper layer of the desired conductivity may be built up as the panels are moved past successive spray nozzles.

The wetting agent (Triton X–114) in the cupric acetate solution was found to provide more uniform film. This wetting agent has a high molecular weight and is an arylalkyl polyether alcohol, although simple, organic, water-soluble solvents such as methyl or ethyl alcohol will reduce the surface tension and improve the deposit.

The concentration of the sensitizing solutions are not critical. For example, the stannous chloride concentration can be varied from 10 to 30 grams per gallon without producing any noticeable difference in its effect. The silver nitrate sensitizing solution should be maintained at around the indicated concentration of about 4 grams per gallon, since anything less seems to impair the deposit to some extent and anything more unnecessarily increases the cost.

In determining the most economical concentration for the cupric acetate and hydrosulphite solutions to give acceptable conductivity to the copper base coat, it was noted that increased amounts of the cupric acetate concentration improved the conductivity considerably. As shown in FIG. 4, in curve I the cupric acetate solution had a concentration of 60 grams per gallon, in curve II the concentration of the cupric acetate was 75 grams per gallon and in curve III its concentration was 90 grams per gallon. (Although the resistance decreases as the concentration of the cupric acetate is increased, the law of diminishing returns sets in as is evident from these curves.)

Each of the cupric acetate solutions listed above was reduced by a hydrosulphite solution containing increasing concentrations of the sodium hydrosulphite to provide the illustrated curves. Curve I flattened out at a resistance of 12 ohms when sprayed with a hydrosulphite solution of a concentration of 125 grams per gallon. Curve II flattened out at 6 ohms when the hydrosulphite solution had a concentration of 150 grams per gallon, whereas curve III leveled off at 4.5 ohms when sprayed with hydrosulphite solution of a concentration of 150 grams per gallon.

It would therefore appear that in order to maintain the resistance of the copper base coat between 4.5 and 12 ohms (the range for acceptable electrical characteristics) for the selected standard panel satisfactory concentration ranges would be about 60–90 grams per gallon cupric acetate and 100–150 grams per gallon hydrosulphite.

From the description above, it is evident that the concentration of the hydrosulphite and the cupric acetate is not critical, but for conductive copper the pH of the sodium hydrosulphite is extremely critical and should be between 11.62 and 11.65 for the concentrations given in connection with the description of FIG. 3 in order that the layer will have optimum electrical conductivity, although FIG. 3 indicates the pH can vary from about 11.4 to 11.7 and still provide a copper coating on the insulating panel of relatively low resistance.

It is also apparent from the foregoing, and from the curves of FIGS. 3 and 4, that pH ranges outside those shown in FIG. 3 may produce satisfactory results for concentrations other than those set forth in conjunction with FIG. 3. By way of example, it is evident from FIG. 4 that an increase in the cupric acetate and sodium hydrosulphite concentrations (such as shown by curve III) will result in a lower optimized conductivity of the base coat (i.e., the "nose" of a curve similar to FIG. 3) and under these conditions a pH value outside the ranges discussed above will provide a copper base coat of relatively low resistivity for subsequent electroplating.

It should be noted that the thickness of the copper base coat formed from the process of this invention is of the order of $(8-12)\times10^{-6}$ inches, whereas the copper conductors electroplated on this base coat have a thickness of the order of $1000\times10^{-6}$ inches. Therefore, removal of the portions of the base coat between the plated conductors by an etching-stripping solution results in an attack on the conductors that is insignificant as compared with their original thickness.

The invention provides, therefore, an improved process whereby a copper base coat is deposited on an insulating surface, which base coat has sufficiently high conductivity to permit a subsequent metallic layer to be electroplated thereon, and which process provides practically instantaneous formation of the copper base coat to permit spray-reduction to be used.

I claim:

1. A process for depositing an adherent, electrically conductive copper layer on a surface on an insulating panel and in the bores of apertures formed therein to prepare the panel for the formation of electrical conductors thereon in the form of a circuit pattern by electroplating metal on said copper layer, said process including the steps of directing a spray of an aqueous solution of cupric acetate against the surface and simultaneously directing a spray of an aqueous alkaline solution of sodium hydrosulphite against the same surface, with said solutions mixing with each other in a solution condition and reacting together to form a coating of copper material extending continuously over the sprayed surface, and controlling the alkalinity of the sodium hydrosulphite solution so as to provide said coating of copper material with sufficient electrical conductivity for the subsequent electroplating operation.

2. A process for depositing an adherent, electrically conductive copper layer on a surface on an insulating panel and in the bores of apertures formed therein to prepare the panel for the formation of electrical conductors thereon in the form of a circuit pattern by electroplating metal on said copper layer, said process including the steps of directing a spray of an aqueous solution of cupric acetate against the surface and simultaneously directing a spray of an aqueous alkaline solution of sodium hydrosulphite against the same surface, with said solutions mixing with each other in a solution condition and reacting together to form a coating of copper material extending continuously over the sprayed surface, adjusting the alkalinity of the sodium hydrosulphite solution to compensate for acetic acid in the aqueous copper acetate solution, and controlling the alkalinity of the compensated sodium hydrosulphite solution so as to provide said coating of copper material with sufficient electrical conductivity for the subsequent electroplating operation.

3. A process for depositing an adherent copper layer on a surface of an insulating panel, said layer being of sufficient conductivity to permit electroplating of a metallic layer thereon for the formation of a plated circuit pattern on the surface of the panel, said process including the steps of moving said insulating panel into contact with successive pairs of converging sprays, one of said sprays in each pair being formed by atomization of an aqueous solution of cupric acetate and the other spray in each pair being formed by hydraulic atomization of an aqueous solution of sodium hydrosulphite and sodium hydroxide, with each successive pair of sprays contacting the surface and increasing the thickness of the copper layer by reduction of the cupric acetate.

4. A continuous process for treating an insulating panel having a pair of opposed surfaces and a plurality of holes formed therethrough, said process being effective to deposit a copper layer on each of said surfaces and in the bores of the holes, said copper layers being of sufficient conductivity to permit subsequent electroplating of conductive circuit patterns on each surface of the panel and of electrical connections in the bores of the holes effective to connect such circuit patterns on opposed surfaces of said panel, said process including the steps of moving said panel between two parallel rows of converging spray pairs so that each surface is simultaneously contacted with a spray pair, one of the sprays in each of said pairs being formed by atomizing an aqueous solution of cupric acetate and the other of the sprays being formed by atomizing an aqueous alkaline solution of sodium hydrosulphite, each of the converging spray pairs reacting to deposit metallic copper on said surface and on said bores of said holes so that each successive pair of sprays increases the thickness of the copper layer so formed.

5. A method of depositing a conductive copper base layer on an insulating panel to prepare the panel for electroplating of electrical conductors thereon in a predetermined circuit pattern, said method comprising spraying an aqueous solution of cupric acetate onto the insulating panel on at least one side thereof, simultaneously spraying an aqueous alkaline solution of sodium hydrosulphite onto the same surface of said insulating panel, with said solutions mixing with each other in a solution condition and reacting together upon such mixing to form a continuous coating of copper material on the one side of the insulating panel, controlling the alkalinity of the sodium hydrosulphite solution so as to provide said coating of copper with sufficient electrical conductivity for the subsequent electroplating operation, and removing residual solution material which results from the aforesaid mixing of said solutions from said insulating panel.

6. In the formation of electrical conductors on both sides of an insulating panel in the form of a plated circuit and the formation of conductor portions on surfaces within the bores of apertures extending through the panel, the method of depositing copper material on the panel and on the surfaces at the apertures to provide a continuous conductive base layer on which the final electrical conductors can be subsequently formed by means of electrodepositing metal on the continuous conductive base layer, said method comprising conditioning the insulating panel to receive copper material thereon by chemical deposition and to cause such copper material to adhere to said panel, simultaneously applying an aqueous solution of cupric acetate and an alkaline solution of sodium hydrosulphite on both sides of said insulating panel and to said surfaces within said apertures such that said solutions mix and the sodium hydrosulphite reduces the cupric acetate to copper material which deposits on said panel in the form of a continuous copper coating on both sides of the panel and on said surfaces within the bores of said apertures, controlling the alkalinity of the sodium hydrosulphite solution so as to provide said coating of copper with sufficient electrical conductivity for the subsequent electrodepositing operation, and removing residual solution material from said insulating panel which results from the application and mixing of said solutions as aforesaid.

7. A process for depositing an adherent electrically conductive copper layer on a surface on an insulating panel and in the bores of apertures formed therein to prepare the panel for the formation of electrical conductors thereon in the form of a circuit pattern by electroplating metal on said copper layer, said process including the steps of directing a pneumatically produced spray of an aqueous solution of cupric acetate against the surface, simultaneously directing a pneumatically produced spray of an aqueous alkaline solution of sodium hydrosulphite against the same surface, adjusting the alkalinity of the sodium hydrosulphite solution so as to provide said coating of copper with sufficient electrical conductivity for the subsequent electroplating operation, and adjusting the volume of said solutions and pattern of said sprays applied to said surface to thereby produce said copper coating with a minimum of excess fluids applied to the surface.

8. A process for depositing an adherent, electrically conductive layer on a surface on an insulating panel and in the bores of apertures formed therein to prepare the panel for formation of electrical conductors thereon in the form of a circuit pattern by electroplating metal on said copper layer, said process including the steps of directing a spray of an aqueous solution of cupric acetate against the surface and simultaneously directing a spray of an aqueous alkaline solution of sodium hydrosulphite against the same surface, with said solutions mixing with each other in a solution condition and reacting together to form a coating of copper material extending continuously over the sprayed surface, and controlling the alkalinity of the sodium hydrosulphite solution with an alkali hydroxide so as to provide said coating of copper material with sufficient electrical conductivity for the subsequent electroplating operation.

9. A process for depositing an adherent, electrically conductive copper layer on a surface of an insulating panel and in the bores of apertures formed therein to prepare the panel for the formation of electrical conductors thereon in the form of a circuit pattern by electroplating metal on said copper layer, said process including the steps of directing a spray of an aqueous solution of cupric acetate against the surface and simultaneously directing a spray of an aqueous alkaline solution of sodium hydrosulphite against the same surface, with said solutions mixing with each other in a solution condition and reacting together to form a coating of copper material extending continuously over the sprayed surface, and controlling the alkalinity of the sodium hydrosulphite solution with an alkali metal salt of alkaline reaction so as to provide said coating of copper material with sufficient electrical conductivity for the subsequent electroplating operation.

10. A process for depositing an adherent, electrically conductive copper layer on a surface of an insulating panel and in the bores of apertures formed therein to prepare the panel for the formation of electrical conductors thereon in the form of a circuit pattern by electroplating metal on said copper layer, said process including the steps of directing a spray of an aqueous solution of cupric acetate against the surface and simultaneously directing a spray of an aqueous alkaline solution of sodium hydrosulphite against the same surface, with said solutions mixing with each other in a solution condition and reacting together to form a coating of copper material extending continuously over the sprayed surface, and controlling the alkalinity of the sodium hydrosulphite solution with an alkali metal hydroxide or salt of alkaline reaction so as to provide said coating of copper material with sufficient electrical conductivity for the subsequent electroplating operation.

11. A process for depositing an adherent, electrically conductive copper layer on a surface on an insulating panel and in the bores of apertures formed therein to prepare the panel for the formation of electrical conductors thereon in the form of a circuit pattern by electroplating metal on said copper layer, said process including the steps of applying an aqueous solution of stannous chloride to the surface, rinsing the surface to reduce the stannous chloride thereon to a trace, applying an aqueous solution of silver nitrate to the surface, directing a spray of an aqueous solution of cupric acetate against the surface and simultaneously directing a spray of an aqueous alkaline solution of sodium hydrosulfite against the same surface, with said solutions mixing with each other in a solution condition and reacting together to form a coating of copper material extending continuously over the sprayed surface, and controlling the alkalinity of the sodium hydrosulfite solution so as to provide said coating of copper material with sufficient electrical conductivity for the subsequent electroplating operation.

12. A process for depositing an adherent, electrically conductive copper layer on a surface on an insulating panel and in the bores of apertures formed therein to prepare the panel for formation of electrical conductors therein in the form of a circuit pattern by electroplating metal on said copper layer, said process including the steps of applying a stannous chloride solution to said surface, rinsing the surface to reduce the stannous chloride thereon to a trace, applying a silver nitrate solution to the surface, directing a spray of an aqueous solution of cupric acetate against the surface and simultaneously directing a spray of an aqueous alkaline solution of sodium hydrosulfite against the same surface, with said solutions mixing with each other in a solution condition and reacting together to form a coating of copper material and extending continuously over the sprayed surface, and controlling the alkalinity of the sodium hydrosulfite solution with sodium hydroxide so as to provide said coating of copper material with sufficient electrical conductivity for the subsequent electroplating operation.

13. In the formation of electrical conductors on both sides of an insulating panel in the form of a plated circuit and the formation of conductor portions on surfaces within the bores of apertures extending through the panel, the method of depositing copper material on the panel and on the surfaces at the apertures to provide a continous conductive base layer on which the final electrical conductors can be subsequently formed by means of electrodepositing metal on the continuous conductive base layer, said method comprising conditioning the insulating panel to receive copper material thereon by applying a stannous chloride solution to said panel, rinsing said panel to reduce the stannous chloride thereon to a trace, applying a silver nitrate solution to said panel, and simultaneously applying an aqueous solution of cupric acetate and an alkaline solution of sodium hydrosulfite on both sides of said panel and to said surfaces within said apertures such that said solution mix and the sodium hydrosulfite reduces to cupric acetate to copper material which deposits on said panel in the form of a continuous copper coating on both sides of the panel and on said surfaces within the bores of said apertures, controlling the alkalinity of said sodium hydrosulfite solution with sodium hydroxide so as to provide said coating of copper material with sufficient electrical conductivity for the subsequent electrodepositing operation, and removing residual solution material from said insulating panel which results from the application and mixing of said solutions as aforesaid.

References Cited in the file of this patent

UNITED STATES PATENTS

| | | |
|---|---|---|
| 1,684,565 | Waller | Sept. 18, 1928 |
| 2,190,121 | Misciattelli | Feb. 13, 1940 |
| 2,783,193 | Nieter | Feb. 26, 1957 |

FOREIGN PATENTS

| | | |
|---|---|---|
| 45,696 | India | Sept. 15, 1962 |